US008816734B2

(12) United States Patent
Jang et al.

(10) Patent No.: US 8,816,734 B2
(45) Date of Patent: Aug. 26, 2014

(54) CLOCK GENERATION CIRCUIT AND SEMICONDUCTOR APPARATUS INCLUDING THE SAME

(71) Applicant: SK hynix Inc., Icheon-si (KR)

(72) Inventors: Jae Min Jang, Icheon-si (KR); Yong Ju Kim, Icheon-si (KR); Dae Han Kwon, Icheon-si (KR); Hae Rang Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,692

(22) Filed: Dec. 12, 2012

(65) Prior Publication Data

US 2014/0002149 A1    Jan. 2, 2014

(30) Foreign Application Priority Data

Jun. 27, 2012  (KR) .......................... 10-2012-0069385

(51) Int. Cl.
*H03L 7/06*    (2006.01)

(52) U.S. Cl.
USPC .......................................... 327/158; 327/149

(58) Field of Classification Search
USPC .................................. 327/147, 156, 149, 158
See application file for complete search history.

(56) References Cited

U.S. PATENT DOCUMENTS 7,111,185 B2 *  9/2006  Gomm et al. ................. 327/158
8,035,431 B2    10/2011  Kim et al.
8,174,324 B2 *  5/2012  Kim et al. ..................... 331/1 A

OTHER PUBLICATIONS

Yongju Kim et al., High-PSRR All-Digital Delay Locked Loop with Burst Update Mode and Power Noise Damping Scheme, p. 1-2, DRAM Design Team, Hynix Semiconductor, Icheon, Korea.

* cited by examiner

*Primary Examiner* — Hai L Nguyen
(74) *Attorney, Agent, or Firm* — William Park & Associates Patent Ltd.

(57) ABSTRACT

A clock generation circuit includes a delay line, a delay modeling block, a phase detection block, a multi-update signal generation block, and a delay line. The delay line delays an input clock and generates a delayed clock. The delay modeling block delays the delayed clock by a modeled delay value and generates a feedback clock. The phase detection block compares phases of the input clock and the feedback clock and generates phase information, and quantizes a phase difference between the input clock and the feedback clock and generates phase codes. The multi-update signal generation block generates a multi-update signal in response to the phase codes. The delay line control block changes a delay amount of the delay line in response to the multi-update signal and the phase information.

18 Claims, 6 Drawing Sheets

CLOCK GENERATION CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2012-0069385, filed on Jun. 27, 2012, in the Korean Intellectual Property Office, which is incorporated herein by reference in its entirety.

BACKGROUND

1. Technical Field

The present invention generally relates to a semiconductor apparatus, and more particularly, to a clock generation circuit of a semiconductor apparatus.

2. Related Art

In general, a semiconductor apparatus including a memory performs an operation in synchronization with a clock. Accordingly, in a synchronous type semiconductor apparatus, input data and output data should be precisely synchronized with an external clock. The semiconductor apparatus receives the external clock, converts the external clock into an internal clock, and uses the converted internal clock. However, as the internal clock is transmitted through a clock buffer and a transmission line, a phase difference occurs between the internal clock and the external clock. Therefore, in order to compensate for the phase difference, the semiconductor apparatus generally includes a phase-locked loop or a delay-locked loop.

The delay-locked loop may increase an effective data output period by compensating for the phase difference occurring between the internal clock and the external clock. The delay-locked loop causes the phase of the internal clock to precede the phase of the external clock by a predetermined time, such that output data can be outputted by being synchronized with the external clock.

FIG. 1 is a block diagram schematically showing the configuration of a conventional delay-locked loop 10. In FIG. 1, the delay-locked loop 10 includes a delay line 11, a delay modeling block 12, a phase detection block 13, an update signal generation block 14, a delay line control block 15, and a clock driver 16. The delay line 11 receives an input clock CLKI and generates a delayed clock CLKD. The delay line 11 delays the input clock CLKI by the value set by the delay line control block 15. The delay modeling block 12 delays the delayed clock CLKD by a modeled delay value and generates a feedback clock CLKF. The phase detection block 13 compares the phases of the input clock CLKI and the feedback clock CLKF and generates a detection signal DET. The update signal generation block 14 receives the detection signal DET and generates an update signal VALID. The delay line control block 15 receives the update signal VALID and may update the delay value of the delay line 11. The clock driver 16 receives the delayed clock CLKD and generates first and second output clocks RCLK_DLL and FCLK_DLL.

In the case where the phase difference between the input clock CLKI and the feedback clock CLKF is large, the delay-locked loop 10 should update the delay value of the delay line 11 by being operated a multitude of times, and thus, a delay locking operation time for generating the output clocks RCLK_DLL and FCLK_DLL is lengthened.

SUMMARY

A clock generation circuit capable of continuously performing a multitude of times an update operation for setting the delay amount of a delay line and a semiconductor apparatus including the same are described herein.

In an embodiment, a clock generation circuit includes: a delay line configured to delay an input clock and generate a delayed clock; a delay modeling block configured to delay the delayed clock by a modeled delay value, and generate a feedback clock; a phase detection block configured to compare phases of the input clock and the feedback clock and generate phase information, and quantize a phase difference between the input clock and the feedback clock and generate phase codes; a multi-update signal generation block configured to generate a multi-update signal in response to the phase codes; and a delay line control block configured to change a delay amount of the delay line in response to the multi-update signal and the phase information.

In an embodiment, a semiconductor apparatus includes: a clock buffer configured to buffer an external clock and generate an input clock; a delay line configured to delay the input clock and generate a delayed clock; a delay modeling block configured to delay the delayed clock by a modeled delay value, and generate a feedback clock; a phase detection block configured to compare phases of the input clock and the feedback clock and generate phase information, and quantize a phase difference between the input clock and the feedback clock and generate phase codes; a multi-update signal generation block configured to generate a multi-update signal in response to the phase codes; a delay line control block configured to change a delay amount of the delay line in response to the multi-update signal and the phase information; and a clock driver configured to buffer the delayed clock and provide an output clock to a clock-synchronized circuit.

BRIEF DESCRIPTION OF THE DRAWINGS

Features, aspects, and embodiments are described in conjunction with the attached drawings, in which.

DETAILED DESCRIPTION

Hereinafter, a clock generation circuit and a semiconductor apparatus including the same according to various embodiments will be described below with reference to the accompanying drawings through the various embodiments.

Figure 1:
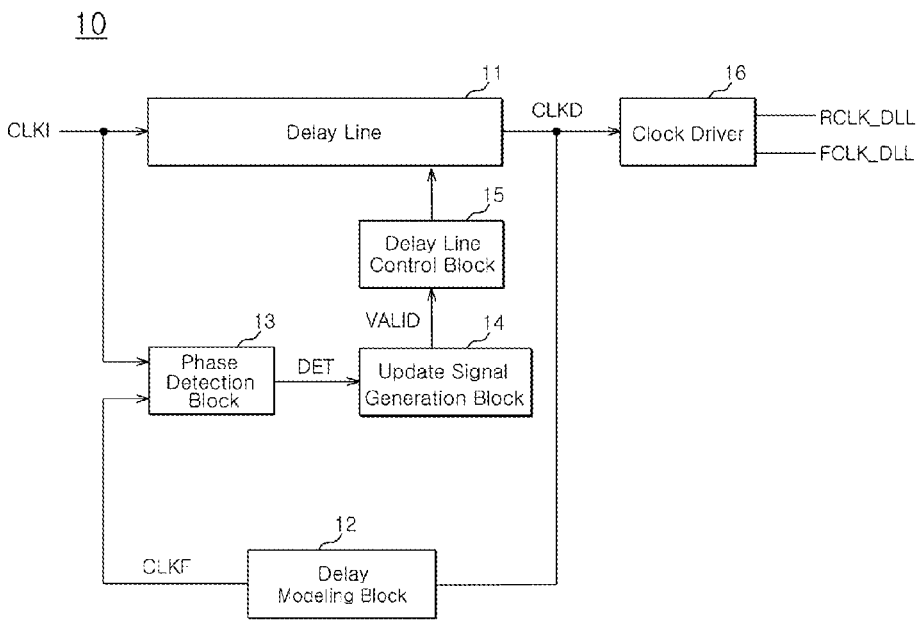
FIG. 1 is a block diagram schematically showing the configuration of a conventional delay-locked loop.
Figure 2:
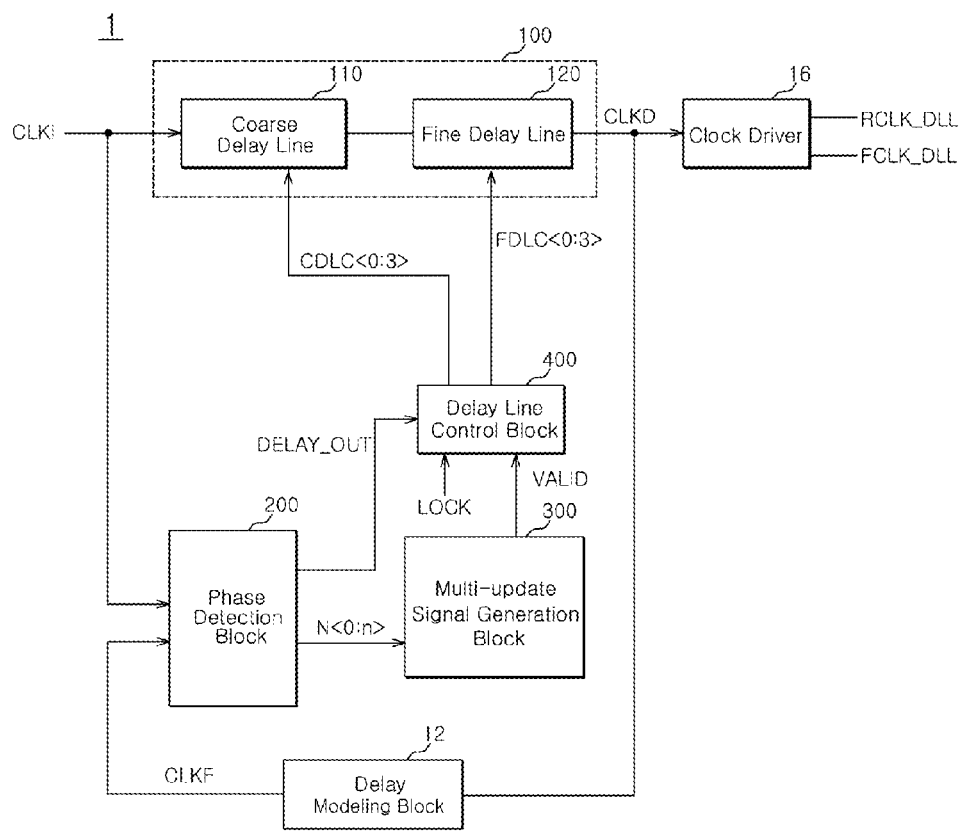
FIG. 2 is a block diagram schematically showing the configuration of a clock generation circuit in accordance with an embodiment.

FIG. 2 is a block diagram schematically showing the configuration of a clock generation circuit 1 in accordance with an embodiment. In FIG. 2, the clock generation circuit 1 may include a delay line 100, a delay modeling block 12, a phase detection block 200, a multi-update signal generation block 300, and a delay line control block 400. The delay line 100 receives an input clock CLKI. The delay line 100 may be configured to delay the input clock CLKI and generate a delayed clock CLKD. The delay line 100 delays the input clock CLKI by a preset delay amount. The delay amount of the delay line 100 may be changed by the delay line control block 400.

The delay line 100 may include a coarse delay line 110 and a fine delay line 120. The delay amount of the coarse delay line 110 is set in response to coarse delay signals CDLC<0: 3>, and the delay amount of the fine delay line 120 is set in response to fine delay signals FDLC<0:3>.

The delay modeling block 12 receives the delayed clock CLKD. The delay modeling block 12 may be configured to delay the delayed clock CLKD by a modeled delay amount and generate a feedback clock CLKF. The modeled delay amount may be optionally set, and for example, may be a value acquired by replicating a time by which a clock inputted from an outside is delayed by an internal circuit.

The phase detection block 200 may be configured to receive the input clock CLKI and the feedback clock CLKF and generate phase information DELAY_OUT and phase codes N<0:n>. The phase detection block 200 may generate the phase information DELAY_OUT by comparing the phases of the input clock CLKI and the feedback clock CLKF. For example, the phase detection block 200 may generate the phase information DELAY_OUT with a high level or a low level (i.e., voltage logic level) depending upon whether the phase of the input clock CLKI precedes or follows the phase of the feedback clock CLKF.

Further, the phase detection block 200 may generate the phase codes N<0:n> by quantizing the phase difference between the input clock CLKI and the feedback clock CLKF. That is to say, the phase detection block 200 may represent the phase difference between the input clock CLKI and the feedback clock CLKF as a code value. For example, the phase detection block 200 may increase the value of the phase codes N<0:n> as the phase difference between the input clock CLKI and the feedback clock CLKF increases, and may decrease the value of the phase codes N<0:n> as the phase difference between the input clock CLKI and the feedback clock CLKF decreases.

The multi-update signal generation block 300 may be configured to receive the phase codes N<0:n> and generate a multi-update signal VALID. The multi-update signal generation block 300 may generate the pulse of the multi-update signal VALID a plurality of times corresponding to the phase codes N<0:n>. For example, as the value of the phase codes N<0:n> is large, the number of the pulses of the multi-update signal VALID increases, and as the value is of the phase codes N<0:n> is small, the number of the pulses of the multi-update signal VALID decreases. Due to the fact that the multi-update signal generation block 300 may generate the multi-update signal VALID having a plurality of pulses corresponding to the phase codes N<0:n>, an update operation for changing the delay amount of the delay line 100 may be continuously performed a multitude of times.

The delay line control block 400 may be configured to receive the multi-update signal VALID and the phase information DELAY_OUT and generate the delay line control signals CDLC<0:3> and FDLC<0:3>. The delay line control block 400 changes the delay amount of the delay line 100 according to the phase information DELAY_OUT each time the pulse of the multi-update signal VALID is enabled. The delay line control block 400 may generate ones of the coarse delay signals CDLC<0:3> and the fine delay signals FDLC<0:3>. In other words, the delay line control block 400 may change the delay amount of one of the coarse delay line 110 and the fine delay line 120. While the coarse delay signals CDLC<0:3> and the fine delay signals FDLC<0:3> were exemplified as 4-bit signals in the embodiment, it is to be noted that the present invention is not limited to such. The number of bits may be changed in conformity with the configuration of the coarse delay line 110 and the fine delay line 120.

The delay line control block 400 may generate ones of the coarse delay signals CDLC<0:3> and the fine delay signals FDLC<0:3> in response to a locking signal LOCK. The clock generation circuit 1 in accordance with an embodiment may perform a fine delay operation after a coarse delay operation is completed. When performing the coarse delay operation, the delay line control block 400 may generate the coarse delay signals CDLC<0:3> according to the phase information DELAY_OUT each time the pulse of the multi-update signal VALID is enabled, and thereby, increases or decreases the delay amount of the coarse delay line 110. When the coarse delay operation is completed, the locking signal LOCK is generated. When the locking signal LOCK is generated, the delay line control block 400 may generate the fine delay signals FDLC<0:3> according to the phase information DELAY_OUT each time the pulse of the multi-update signal VALID is enabled, and thereby, increases or decreases the delay amount of the fine delay line 120.

In FIG. 2, the clock generation circuit 1 further may include a clock driver 16. The clock driver 16 may be configured to receive the delayed clock CLKD and generate first and second synchronized clocks RCLK_DLL and FCLK_DLL. The first and second synchronized clocks RCLK_DLL and FCLK_DLL are provided to those circuits among the internal circuits of a semiconductor apparatus, which operate in synchronization with a clock.

Figure 3:
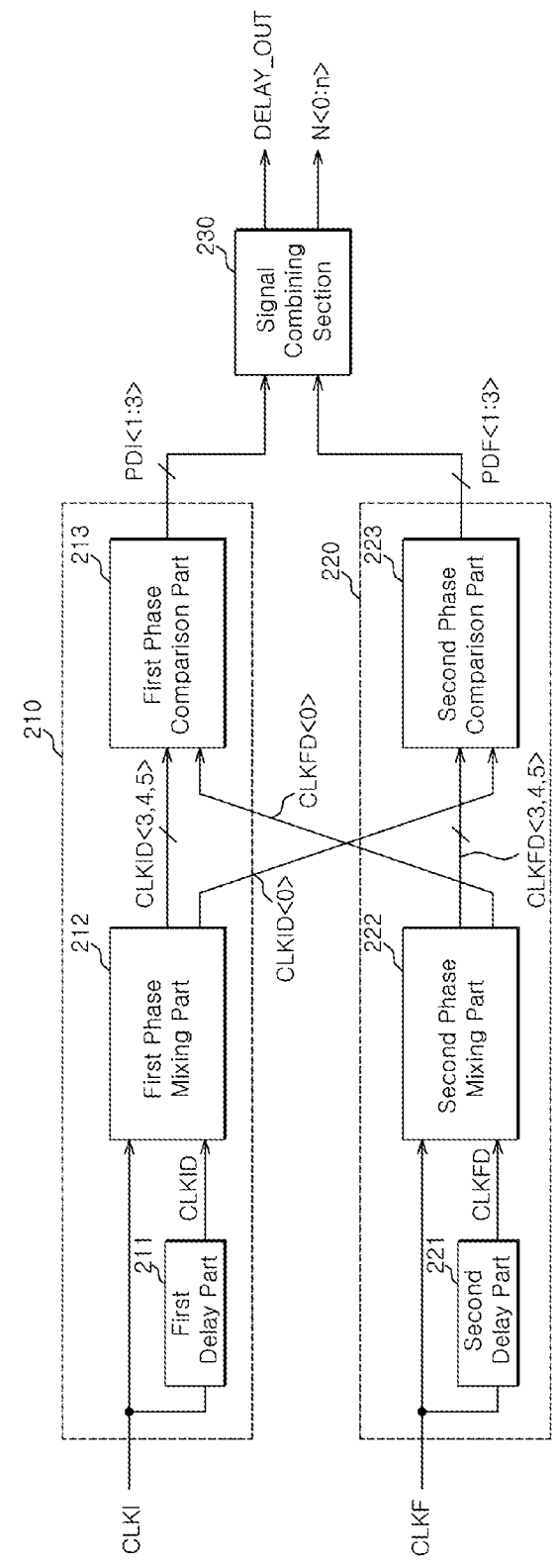
FIG. 3 is a block diagram showing the configuration of an embodiment of the phase detection block of FIG. 2.

FIG. 3 is a block diagram schematically showing the configuration of an embodiment of the phase detection block 200 of FIG. 2. In FIG. 3, the phase detection block 200 may include a first phase detection signal generating section 210, a second phase is detection signal generating section 220, and a signal combining section 230. The first phase detection signal generating section 210 may generate a plurality of input sampling clocks with different phases, from the input clock CLKI. The first phase detection signal generating section 210 may be configured to compare the phases of the plurality of input sampling clocks and the feedback clock CLKF and generate first phase detection signals PDI<1:3>.

The second phase detection signal generating section 220 may generate a plurality of feedback sampling clocks with different phases, from the feedback clock CLKF. The second phase detection signal generating section 220 may be configured to compare the phases of the plurality of feedback sampling clocks and the input clock CLKI and generate second phase detection signals PDF<1:3>.

The signal combining section 230 may be configured to receive the first and second phase detection signals PDI<1:3> and PDF<1:3> and generate the phase information DELAY_OUT and the phase codes N<0:n>. As described above, the phase information DELAY_OUT has information as to whether the phase of the feedback clock CLKF precedes or follows the phase of the input clock CLKI, and the phase codes N<0:n> have information as to the value acquired by quantizing the phase difference between the feedback clock CLKF and the input clock CLKI.

In FIG. 3, the first phase detection signal generating section 210 may include a first delay part 211, a first phase mixing part 212, and a first phase comparison part 213. The first delay part 211 may be configured to delay the input clock CLKI by a unit time and generate a delayed input clock CLKID. The unit time may be optionally set and may be shorter than one half cycle of the input clock CLKI. Also, the unit time may be a delay amount setting unit of the coarse delay line 110.

The first phase mixing part 212 may be configured to mix the phases of the input clock CLKI and the delayed input clock CLKID and generate a plurality of input sampling clocks CLKID<3,4,5> with different phases. The first phase comparison part 213 may be configured to compare the phases of the plurality of respective input sampling clocks CLKID<3,4,5> and the feedback clock CLKF (i.e., CLKFD<0>) and generate the first phase detection signals PDI<1:3>. The first phase detection signals PDI<1:3> may include a plurality bits. Respective results of comparing the phases of the plurality of input sampling clocks CLKID<3,4,5> and the feedback clock CLKF may be provided as the respective bits of the first phase detection signals PDI<1:3>.

The first phase mixing part 212 may generate the plurality of input sampling clocks CLKID<3,4,5> with different phases, within a delay range of the unit time. The first phase comparison part 213 compares the respective input sampling clocks CLKID<3,4,5> and the feedback clock CLKF, and may quantize the phase difference between the input clock CLKI and the feedback clock CLKF.

The second phase detection signal generating section 220 may include a second delay part 221, a second phase mixing part 222, and a second phase comparison part 223. The second delay part 221 may be configured to delay the feedback clock CLKF by the unit time and generate a delayed feedback clock CLKFD.

The second phase mixing part 222 may be configured to mix the phases of the feedback clock CLKF and the delayed feedback clock CLKFD and generate a plurality of feedback sampling clocks CLKFD<3,4,5> with different phases. The second phase comparison part 223 may be configured to compare the phases of the plurality of respective feedback sampling clocks CLKFD<3,4,5> and the input clock CLKI (i.e., CLKID<0>) and generate the second phase detection signals PDF<1:3>. The second phase detection signals PDF<1:3> include a plurality bits. Respective results of comparing the phases of the plurality of feedback sampling clocks CLKFD<3,4,5> and the input clock CLKI may be provided as the respective bits of the second phase detection signals PDF<1:3>.

The second phase mixing part 222 may generate the plurality of feedback sampling clocks CLKFD<3,4,5> with different phases, within a delay range of the unit time. The second phase comparison part 223 compares the respective feedback sampling clocks CLKFD<3,4,5> and the input clock CLKI, and may quantize the phase difference between the input clock CLKI and the feedback clock CLKF.

Figure 4:
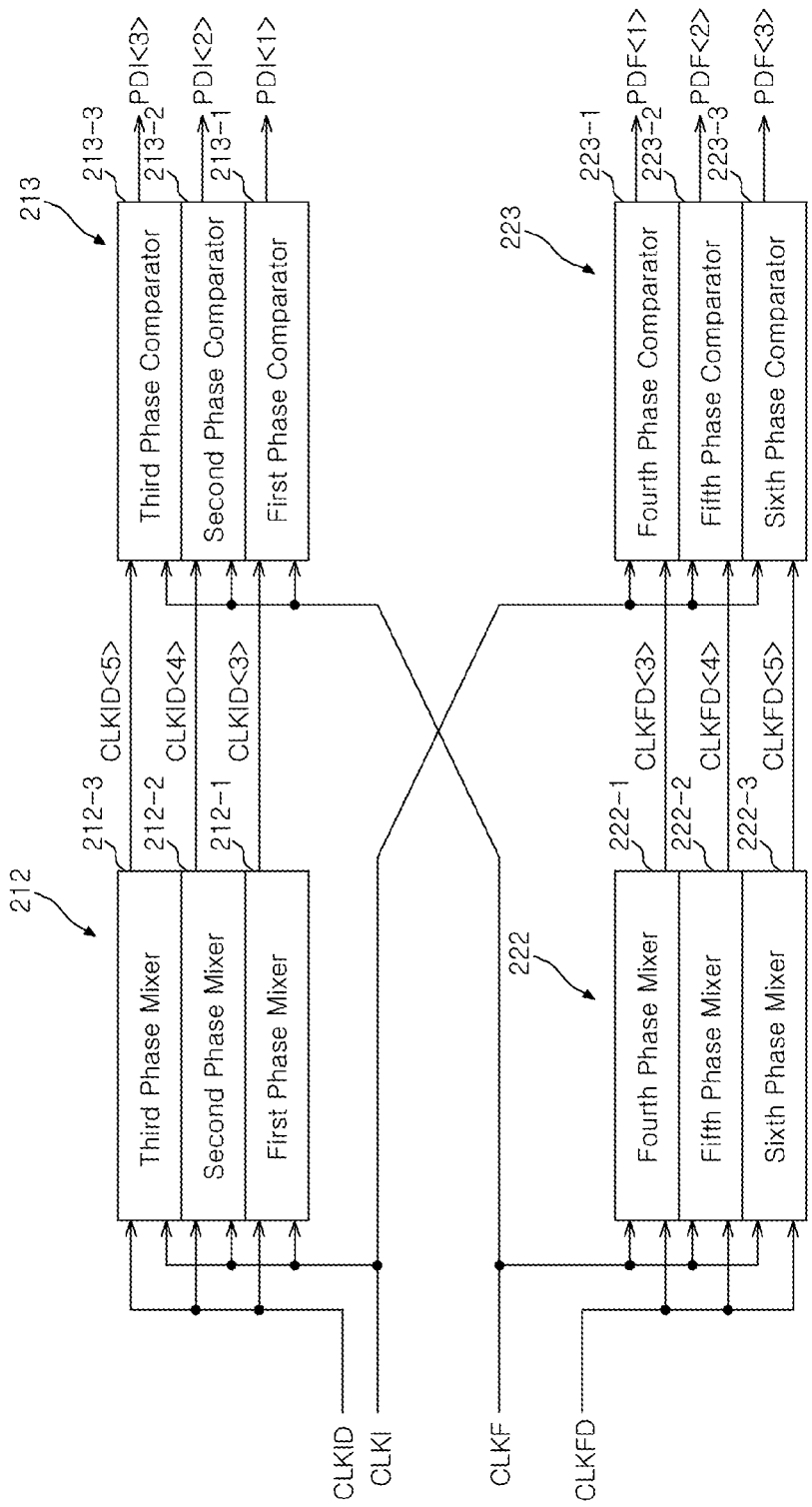
FIG. 4 is a block diagram showing the configurations of the first and second phase mixing parts and the first and second phase comparison parts of FIG. 3.

FIG. 4 is a block diagram showing the configurations of the first and second phase mixing parts and the first and second phase comparison parts of FIG. 3.

FIG. 4 is a block diagram showing the configurations of the first and second phase mixing parts 212 and 222 and the first and second phase comparison parts 213 and 223 of FIG. 3. In FIG. 4, the first phase mixing part 212 may include first to third phase mixers 212-1, 212-2 and 212-3, and the first phase comparison part 213 may include first to third phase comparators 213-1, 213-2 and 213-3. The first phase mixer 212-1 may be configured to mix the input clock CLKI and the delayed input clock CLKID and generate the first input sampling clock CLKID<3> with a first phase. The first phase mixer 212-1 may generate, for example, the clock acquired by delaying the input clock CLKI by a $3/7$ unit time, as the first input sampling clock CLKID<3> with the first phase.

The second phase mixer 212-2 may be configured to mix the input clock CLKI and the delayed input clock CLKID and generate the second input sampling clock CLKID<4> with a second phase. The second phase mixer 212-2 may generate, for example, the clock acquired by delaying the input clock CLKI by a $4/7$ unit time, as the second input sampling clock CLKID<4> with the second phase.

The third phase mixer 212-3 may be configured to mix the input clock CLKI and the delayed input clock CLKID and generate the third input sampling clock CLKID<5> with a third phase. The third phase mixer 212-3 may generate, for example, the clock acquired by delaying the input clock CLKI by a $5/7$ unit time, as the third input sampling clock CLKID<5> with the third phase. While it was exemplified in an embodiment that the clocks acquired by delaying the input clock CLKI by $3/7$, $4/7$, and $5/7$ unit times are provided as clocks to be compared with the feedback clock CLKF, it is to be noted that the embodiments are not limited to such, and the input sampling clocks CLKID<3,4,5> may be generated by setting delay amounts in a variety of ways.

The first phase comparator 213-1 may be configured to compare the phases of the first input sampling clock CLKID<3> and the feedback clock CLKF and generate the first bit PDI<1> of the first phase detection signals PDI<1:3>. The second phase comparator 213-2 may be configured to compare the phases of the second input sampling clock CLKID<4> and the feedback clock CLKF and generate the second bit PDI<2> of the first phase detection signals PDI<1:3>. The third phase comparator 213-3 may be configured to compare the phases of the third input sampling clock CLKID<5> and the feedback clock CLKF and generate the third bit PDI<3> of the first phase detection signals PDI<1:3>.

In FIG. 4, the second phase mixing part 222 may include fourth to sixth phase mixers 222-1, 222-2 and 222-3, and the second phase comparison part 223 may include fourth to sixth phase comparators 223-1, 223-2 and 223-3. The fourth phase mixer 222-1 may be configured to mix the feedback clock CLKF and the delayed feedback clock CLKFD and generate the first feedback sampling clock CLKFD<3> with a fourth phase. The fourth phase mixer 222-1 may generate, for example, the clock acquired by delaying the feedback clock CLKF by a $3/7$ unit time, as the first feedback sampling clock CLKFD<3> with the fourth phase.

The fifth phase mixer 222-2 may be configured to mix the feedback clock CLKF and the delayed feedback clock CLKFD and generate the second feedback sampling clock CLKFD<4> with a fifth phase. The fifth phase mixer 222-2 may generate, for example, the clock acquired by delaying the feedback clock CLKF by a $4/7$ unit time, as the second feedback sampling clock CLKFD<4> with the fifth phase.

The sixth phase mixer 222-3 may be configured to mix the feedback clock CLKF and the delayed feedback clock CLKFD and generate the third feedback sampling clock CLKFD<5> with a sixth phase. The sixth phase mixer 222-3 may generate, for example, the clock acquired by delaying the feedback clock CLKF by a $5/7$ unit time, as the third feedback sampling clock CLKFD<5> with the sixth phase. While it was exemplified in an embodiment that the clocks acquired by delaying the feedback clock CLKF by $3/7$, $4/7$ and $5/7$ unit times are provided as clocks to be compared with the input clock CLKI, it is to be noted that the embodiments are not limited to such, and the feedback sampling clocks CLKFD<3,4,5> may be generated by setting delay amounts in a variety of ways.

The fourth phase comparator 223-1 may be configured to compare the phases of the first feedback sampling clock CLKFD<3> and the input clock CLKI and generate the first bit PDF<1> of the second phase detection signals PDF<1:3>.

The fifth phase comparator 223-2 may be configured to compare the phases of the second feedback sampling clock CLKFD<4> and the input clock CLKI and generate the second bit PDF<2> of the second phase detection signals PDF<1:3>. The sixth phase comparator 223-3 may be configured to compare the phases of the third feedback sampling clock CLKFD<5> and the input clock CLKI and generate the third bit PDF<3> of the second phase detection signals PDF<1:3>.

Figure 5:
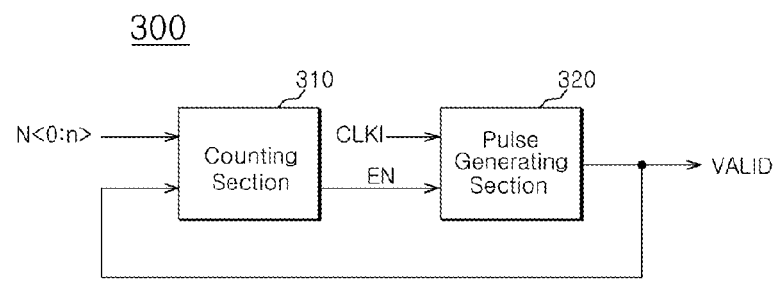
FIG. 5 is a block diagram showing the configuration of the multi-update signal generation block of FIG. 2.

FIG. 5 is a block diagram showing the configuration of the multi-update signal generation block 300 of FIG. 2. In FIG. 5, the multi-update signal generation block 300 may include a counting section 310 and a pulse generating section 320. The counting section 310 receives the phase codes N<0:n> and the multi-update signal VALID. The counting section 310 may be configured to compare the value corresponding to the phase codes N<0:n> and the number of pulse generation times of the multi-update signal VALID and generate an enable signal EN. The counting section 310 may enable the enable signal EN when the phase codes N<0:n> are inputted, and may disable the enable signal EN when the value corresponding to the phase codes N<0:n> and the number of pulse generation times of the multi-update signal VALID become the same with each other.

The pulse generating section 320 may be configured to generate the pulses of the multi-update signal VALID during the period in which the enable signal EN is enabled. For example, the pulse generating section 320 may generate the pulses of the multi-update signal VALID in synchronization with the input clock CLKI.

The counting section 310 may retain the enabled state of the enable signal EN such that the pulses of the multi-update signal VALID may be generated by the number corresponding to the value of the phase codes N<0:n>. The pulse generating section 320 may consecutively generate the pulses of the multi-update signal VALID during the period in which the enable signal EN is enabled.

Figure 6:
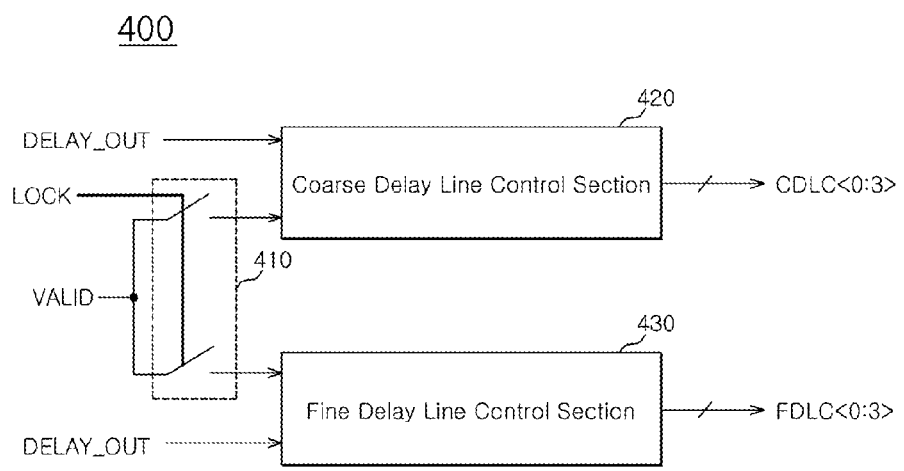
FIG. 6 is a block diagram showing the configuration of an embodiment of the delay line control block of FIG. 2.

FIG. 6 is a block diagram showing the configuration of an embodiment of the delay line control block 400 of FIG. 2. In FIG. 6, the delay line control block 400 may include a switching section 410, a coarse delay line control section 420, and a fine delay line control section 430. The switching section 410 may be configured to provide the multi-update signal VALID to one of the coarse delay line control section 420 and the fine delay line control section 430 in response to the locking signal LOCK.

The coarse delay line control section 420 may be configured to generate the coarse delay signals CDLC<0:3> in response to the multi-update signal VALID and the phase information DELAY_OUT. The coarse delay line control section 420 may generate the coarse delay signals CDLC<0:3> according to the level of the phase information DELAY_OUT when the pulse of the multi-update signal VALID is enabled. For example, when the pulse of the multi-update signal VALID is enabled and the level of the phase information DELAY_OUT is a high level, the coarse delay line control section 420 may generate the coarse delay signals CDLC<0:3> for increasing the delay amount of the coarse delay line 110. Further, when the pulse of the multi-update signal VALID is enabled and the level of the phase is information DELAY_OUT is a low level, the coarse delay line control section 420 may generate the coarse delay signals CDLC<0:3> for decreasing the delay amount of the coarse delay line 110.

The fine delay line control section 430 may be configured to generate the fine delay signals FDLC<0:3> in response to the multi-update signal VALID and the phase information DELAY_OUT. The fine delay line control section 430 may generate the fine delay signals FDLC<0:3> according to the level of the phase information DELAY_OUT when the pulse of the multi-update signal VALID is enabled. For example, similar to the coarse delay line control section 420, when the pulse of the multi-update signal VALID is enabled and the level of the phase information DELAY_OUT is a high level, the fine delay line control section 430 may generate the fine delay signals FDLC<0:3> for increasing the delay amount of the fine delay line 120. Further, when the pulse of the multi-update signal VALID is enabled and the level of the phase information DELAY_OUT is a low level, the fine delay line control section 430 may generate the fine delay signals FDLC<0:3> for decreasing the delay amount of the fine delay line 120.

The clock generation circuit 1 in accordance with an embodiment compares the phases of the input clock CLKI and the feedback clock CLKF and may generate the phase information DELAY_OUT and the phase codes N<0:n>. The clock generation circuit 1 provides information as to which one of the phases of the input clock CLKI and the feedback clock CLKF precedes, as the phase information DELAY_OUT, such that the delay line control block 400 may increase or decrease the delay amount of the delay line 100. Moreover, the clock generation circuit 1 provides the phase codes N<0:n> by quantizing the phase difference between the input clock CLKI and the feedback clock CLKF, and may generate the multi-update signal VALID which has pulses enabled a plurality of times. That is to say, the clock generation circuit 1 may perform a multitude of times update of the delay amount of the delay line 100 by comparing one time the phases of the input clock CLKI and the feedback clock CLKF. Accordingly, an embodiment may allow a quick delay locking operation of a clock generation circuit and may improve the operation speed of a semiconductor apparatus.

Figure 7:
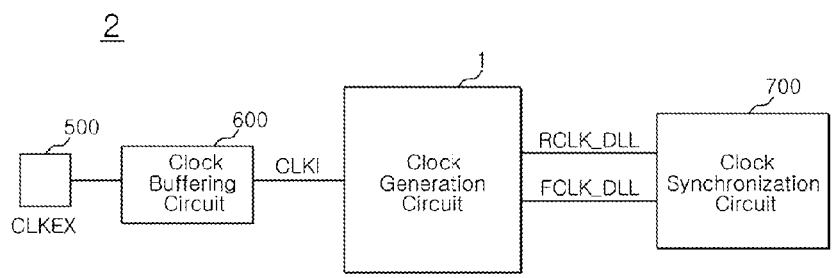
FIG. 7 is a block diagram showing the configuration of a semiconductor apparatus in accordance with an embodiment.

FIG. 7 is a block diagram showing the configuration of a semiconductor apparatus 2 in accordance with an embodiment. In FIG. 7, the semiconductor apparatus 2 may include a clock pad 500, a clock buffering circuit 600, a clock generation circuit 1, and a clock synchronization circuit 700. An external clock CLKEX may be inputted into the semiconductor apparatus 2 through the clock pad 500.

The clock buffering block 600 may be configured to buffer the external clock CLKEX and generate an input clock CLKI. The clock generation circuit 1 may be configured to control the phase of the input clock CLKI and generate first and second synchronized clocks RCLK_DLL and FCLK_DLL.

The clock synchronization circuit 700 performs an operation is in synchronization with the first and second synchronized clocks RCLK_DLL and FCLK_DLL. The clock synchronization circuit 700 may include, a circuit, for example, such as a data output circuit and an output enable signal generation circuit.

While various embodiments have been described above, it will be understood to those skilled in the art that the embodiments described are by way of example only. Accordingly, the clock generation circuit and the semiconductor apparatus including the same described herein should not be limited based on the described embodiments.

What is claimed is:
1. A clock generation circuit comprising:
 a delay line configured to delay an input clock and generate a delayed clock;
 a delay modeling block configured to delay the delayed clock by a modeled delay value, and generate a feedback clock;

a phase detection block configured to compare phases of the input clock and the feedback clock and generate phase information, and to quantize a phase difference between the input clock and the feedback clock to generate phase codes;

a multi-update signal generation block configured to generate a multi-update signal in response to the phase codes, wherein the multi-update signal generation block generates pulses of the multi-update signal by the number of times corresponding to a value of the phase codes; and a delay line control block configured to change a delay amount of the delay line in response to the multi-update signal and the phase information.

2. The clock generation circuit according to claim 1, wherein the phase detection block comprises:

a first phase detection signal generating section configured to generate a plurality of input sampling clocks with different phases, from the input clock, and compare phases of the plurality of input sampling clocks and the feedback clock and generate first phase detection signals;

a second phase detection signal generating section configured to generate a plurality of feedback sampling clocks with different phases, from the feedback clock, and compare phases of the plurality of feedback sampling clocks and the input clock and generate second phase detection signals; and a signal combining section configured to combine the first and second phase detection signals, and generate the phase information and the phase codes.

3. The clock generation circuit according to claim 2, wherein the first phase detection signal generating section comprises:

a first delay part configured to delay the input clock by a unit time and generate a delayed input clock;

a first phase mixing part configured to mix phases of the input clock and the delayed input clock and generate the plurality of input sampling clocks; and a first phase comparison part configured to compare phases of the plurality of input sampling clocks and the feedback clock and generate the first phase detection signals.

4. The clock generation circuit according to claim 3, wherein the first phase mixing part comprises:

a first phase mixer configured to mix the phases of the input clock and the delayed input clock and generate a first input sampling clock with a first phase in the unit time; and a second phase mixer configured to mix the phases of the input clock and the delayed input clock and generate a second input sampling clock with a second phase in the unit time.

5. The clock generation circuit according to claim 4, wherein the first phase comparison part comprises:

a first phase comparator configured to compare the first input sampling clock and the feedback clock and generate a first bit of the first phase detection signal; and a second phase comparator configured to compare the second input sampling clock and the feedback clock and generate a second bit of the first phase detection signal.

6. The clock generation circuit according to claim 2, wherein the second phase detection signal generating section comprises:

a second delay part configured to delay the feedback clock by a unit time and generate a delayed feedback clock;

a second phase mixing part configured to mix phases of the feedback clock and the delayed feedback clock and generate the plurality of feedback sampling clocks; and a second phase comparison part configured to compare phases of the plurality of feedback sampling clocks and the input clock and generate the second phase detection signals.

7. The clock generation circuit according to claim 6, wherein the second phase mixing part comprises:

a third phase mixer configured to mix the phases of the feedback clock and the delayed feedback clock and generate a first feedback sampling clock with a third phase in the unit time; and a fourth phase mixer configured to mix the phases of the feedback clock and the delayed feedback clock and generate a second feedback sampling clock with a fourth phase in the unit time.

8. The clock generation circuit according to claim 6, wherein the second phase comparison part comprises:

a third phase comparator configured to compare the first feedback sampling clock and the input clock and generate a first bit of the second phase detection signal; and a fourth phase comparator configured to compare the second feedback sampling clock and the input clock and generate a second bit of the second phase detection signal.

9. The clock generation circuit according to claim 1, wherein the delay line comprises a coarse delay line and a fine delay line, and wherein the delay line control block changes a delay amount of one of the coarse delay line and the fine delay line according to the phase information each time the multi-update signal is enabled.

10. A semiconductor apparatus comprising:

a clock buffer configured to buffer an external clock and generate an input clock;

a delay line configured to delay the input clock and generate a delayed clock;

a delay modeling block configured to delay the delayed clock by a modeled delay value, and generate a feedback clock;

a phase detection block configured to compare phases of the input clock and the feedback clock and generate phase information, and to quantize a phase difference between the input clock and the feedback clock to generate phase codes;

a multi-update signal generation block configured to generate a multi-update signal in response to the phase codes, wherein the multi-update signal generation block generates pulses of the multi-update signal by the number of times corresponding to a value of the phase codes;

a delay line control block configured to change a delay amount of the delay line in response to the multi-update signal and the phase information; and a clock driver configured to buffer the delayed clock and provide an output clock to a clock-synchronized circuit.

11. The semiconductor apparatus according to claim 10, wherein the delay line comprises a coarse delay line and a fine delay line, and wherein the delay line control block changes a delay amount of one of the coarse delay line and the fine delay line according to the phase information each time the multi-update signal is enabled.

12. The semiconductor apparatus according to claim 10, wherein the phase detection block comprises:

a first phase detection signal generating section configured to generates a plurality of input sampling clocks with different phases, from the input clock, and compare phases of the plurality of input sampling clocks and the feedback clock and generate first phase detection signals;

a second phase detection signal generating section configured to generate a plurality of feedback sampling clocks with different phases, from the feedback clock, and compare phases of the plurality of feedback sampling clocks and the input clock and generate second phase detection signals; and a signal combining section configured to combine the first and second phase detection signals, and generate the phase information and the phase codes.

13. The semiconductor apparatus according to claim 12, wherein the first phase detection signal generating section comprises:

a first delay part configured to delay the input clock by a unit time and generate a delayed input clock;

a first phase mixing part configured to mix phases of the input clock and the delayed input clock and generate the plurality of input sampling clocks; and a first phase comparison part configured to compare phases of the plurality of input sampling clocks and the feedback clock and generate the first phase detection signals.

14. The semiconductor apparatus according to claim 13, wherein the first phase mixing part comprises:

a first phase mixer configured to mix the phases of the input clock and the delayed input clock and generate a first input sampling clock with a first phase in the unit time; and a second phase mixer configured to mix the phases of the input clock and the delayed input clock and generate a second input sampling clock with a second phase in the unit time.

15. The semiconductor apparatus according to claim 14, wherein the first phase comparison part comprises:

a first phase comparator configured to compare the first input sampling clock and the feedback clock and generate a first bit of the first phase detection signal; and a second phase comparator configured to compare the second input sampling clock and the feedback clock and generate a second bit of the first phase detection signal.

16. The semiconductor apparatus according to claim 12, wherein the second phase detection signal generating section comprises:

a second delay part configured to delay the feedback clock by a unit time and generate a delayed feedback clock;

a second phase mixing part configured to mix phases of the feedback clock and the delayed feedback clock and generate the plurality of feedback sampling clocks; and a second phase comparison part configured to compare phases of the plurality of feedback sampling clocks and the input clock and generate the second phase detection signals.

17. The semiconductor apparatus according to claim 16, wherein the second phase mixing part comprises:

a third phase mixer configured to mix the phases of the feedback clock and the delayed feedback clock and generate a first feedback sampling clock with a third phase in the unit time; and a fourth phase mixer configured to mix the phases of the feedback clock and the delayed feedback clock and generate a second feedback sampling clock with a fourth phase in the unit time.

18. The semiconductor apparatus according to claim 17, wherein the second phase comparison part comprises:

a third phase comparator configured to compare the first feedback sampling clock and the input clock and generate a first bit of the second phase detection signal; and a fourth phase comparator configured to compare the second feedback sampling clock and the input clock and generate a second bit of the second phase detection signal.

* * * * *